United States Patent
Hedengren et al.

[11] Patent Number: 6,084,174
[45] Date of Patent: Jul. 4, 2000

[54] METHOD FOR DETECTING TEMPERATURE GRADIENTS IN BIOLOGICAL TISSUE USING A THERMOCOUPLE ARRAY

[75] Inventors: Kristina Helena Valborg Hedengren, Schenectady; William Paul Kornrumpf, Albany; Mark Lloyd Miller, Schenectady, all of N.Y.

[73] Assignee: General Electric Company, Schenectady, N.Y.

[21] Appl. No.: 09/313,531

[22] Filed: May 12, 1999

Related U.S. Application Data

[63] Continuation of application No. 08/632,809, Apr. 17, 1996, Pat. No. 5,909,004.

[51] Int. Cl.[7] .................................................. H01L 35/34
[52] U.S. Cl. .......................... 136/201; 136/225; 136/232; 374/179
[58] Field of Search .................................. 136/200, 201, 136/224, 225, 232; 374/179

[56] References Cited

U.S. PATENT DOCUMENTS

| | | | |
|---|---|---|---|
| 1,552,284 | 9/1925 | Evins | 136/224 |
| 1,622,887 | 3/1927 | Smith | 136/224 |
| 1,648,939 | 11/1927 | Evins | 136/224 |
| 1,715,316 | 5/1929 | Thwing | 136/224 |
| 1,752,117 | 3/1930 | Smith | 136/224 |
| 3,219,993 | 11/1965 | Schwertz | 340/324 |
| 3,554,815 | 1/1971 | Osborn | 136/203 |
| 4,001,046 | 1/1977 | Weiss et al. | 136/205 |
| 4,047,436 | 9/1977 | Bernard et al. | 73/362 |
| 4,343,960 | 8/1982 | Eguchi et al. | 136/225 |
| 4,488,269 | 12/1984 | Robinson et al. | 136/213 |
| 4,490,053 | 12/1984 | Coston et al. | 374/5 |
| 4,513,201 | 4/1985 | Falk | 250/342 |
| 4,558,342 | 12/1985 | Sclar | 357/30 |
| 4,631,350 | 12/1986 | Germanton et al. | 136/225 |
| 5,180,440 | 1/1993 | Siegel et al. | 136/230 |
| 5,411,600 | 5/1995 | Rimai et al. | 136/225 |
| 5,560,711 | 10/1996 | Bu | 374/109 |
| 5,909,004 | 6/1999 | Hedengren et al. | 136/201 |

FOREIGN PATENT DOCUMENTS

| | | |
|---|---|---|
| 2238-252 | 7/1973 | France . |
| 58-10875 | 1/1983 | Japan . |

*Primary Examiner*—Kathryn Gorgos
*Assistant Examiner*—Thomas H Parsons
*Attorney, Agent, or Firm*—Ann M. Agosti; Jill M. Breedlove

[57] ABSTRACT

A thermocouple array includes a dielectric layer having via openings therethrough, a first patterned conductive layer facing one surface of the dielectric layer, and a second patterned conductive layer facing another surface of the dielectric layer. Portions of the second patterned conductive layer can extend through the via openings to couple respective portions of the first patterned conductive layer. The second patterned conductive layer has a different thermal emf than the first patterned conductive layer. The dielectric layer, the first patterned conductive layer, and the second patterned conductive layer can be surface-conformable.

2 Claims, 3 Drawing Sheets

METHOD FOR DETECTING TEMPERATURE GRADIENTS IN BIOLOGICAL TISSUE USING A THERMOCOUPLE ARRAY

This application is a continuation division of application Ser. No. 08/632,809, filed Apr. 17, 1996, now U.S. Pat. No. 5,909,004 which is hereby incorporated by reference in its entirety.

BACKGROUND OF THE INVENTION

Infrared sensors have been used to attempt to measure small temperature gradients in industrial materials and biological tissue. Measurements of temperature distributions in human tissue to detect tumors, for example, must map the surface temperature accurately so that any contribution from internal tumors can be properly detected. Infrared sensors can become unreliable because external conditions such as air flow between the sensors and the sensed region can corrupt the temperature measurements.

Conventional temperature transducers include thermocouples, resistance-temperature detectors, thermistors, and integrated sensors. Each of the above types of transducers, except for the thermocouples, is an active device requiring an external power supply. The thermocouple is a passive device which senses temperature using the thermoelectric principle that when two dissimilar electrically conductive materials are joined, an electrical potential (voltage) is developed between these two materials. Each such individual material can be called a thermoelectric material. The voltage between the materials varies with the temperature of the junction (joint) between the materials. Thermocouples which are useful in practical applications provide approximately linear changes in voltage corresponding to changes in temperature over a useful temperature range. Useful temperature ranges are generally several hundred degrees Celsius and typically occur from absolute zero to the melting point of one or more of the two materials (or, if applicable, a lower temperature that causes the pair of materials to function less linearly).

The voltage varies according to the conductor materials used for the two metals. The voltage cannot be measured directly because the leads to a voltmeter establish a new thermoelectric circuit when they are coupled to the thermocouple leads. Accurate voltage measurements across the thermal junction can be made by instrumentation systems by bringing the thermocouple leads through an isothermal junction block to equilibrate the temperatures of the leads.

Conventional thermocouples are generally fabricated by welding two dissimilar wires. When precise measurements which do not affect the thermal environment are required, the wires are reduced in diameter to eliminate effects of thermal conductivity along the wires, and the thermocouple becomes more fragile. Using conventional thermocouples to measure temperature gradients across a large area involves the fabrication of a thermocouple array connected to a voltmeter with a sequential scanner such as a reed relay scanner. Mechanical support is required for the fragile thermocouple wires. These thermocouple arrays and mechanical supports are not capable of conforming to irregularly-shaped surfaces. Other limiting factors are the precision, accuracy and uniformity of the thermocouple sensors and their thermal junctions created by physical joining or welding.

SUMMARY OF THE INVENTION

It would be desirable to provide an array of precisely fabricated temperature transducers for measuring small temperature gradients in biological tissue, which may be irregularly-shaped, or industrial materials, such as composites and thermal barrier coatings.

In the present invention, flexible, highly precise arrays of thermocouples are fabricated for measuring temperature gradients in biological or industrial materials using photolithographic techniques on insulated films coated with patterns of conductive materials. The flexible arrays can be placed in direct contact with and conform to the surface to be measured. Direct contact with the material reduces temperature effects due to the air interface which occurs when conventional infrared sensors are used.

In addition to detection of temperature gradients caused by breast tumors, the present invention can be used, for example, to examine other biological tissues or organs of interest by evaluating blood flow. Estimating temperatures and temperature gradients on industrial materials can be used, for example, to provide information about curing rates and conditions of composites as well as information about the thermal response to local heating, such as thermal leakage through coatings (which may be indicative of the coating quality) or temperature gradients in metals (which may indicate the presence of surface-breaking or sub-surface cracks). Because the thermocouple arrays of the present invention can be very thin, they can be embedded in materials to test varying process parameters.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
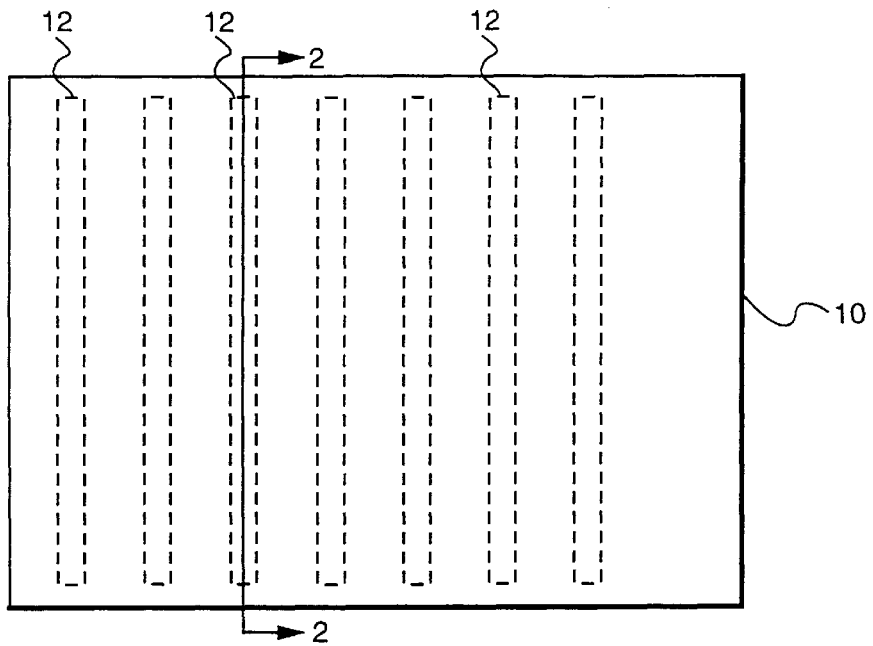
FIG. 1 is a top view of a dielectric layer and a first patterned conductive layer.
Figure 2:
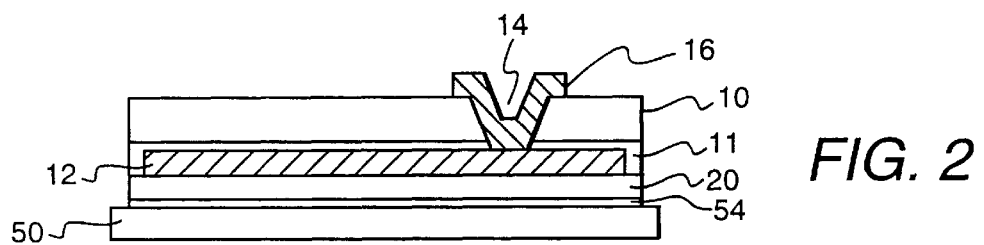
FIG. 2 is a side view along line 2—2 of FIG. 1 further illustrating a via opening in the dielectric layer and a second patterned conductive layer extending through the via opening.

FIG. 1 is a top view of a first patterned conductive layer 12 facing a dielectric layer 10, and FIG. 2 is a side view along line 2—2 of FIG. 1 further illustrating a via opening 14 in dielectric layer 10 and a second patterned conductive layer 16 extending through the via opening and facing the dielectric layer. The term "facing" is meant to include situations wherein another material, such as an adhesive, for example, may be present between a conductive layer and the dielectric layer.

In one embodiment, a support layer 20 is laminated with an adhesive 54, for example, on a removable support carrier 50. The support layer may comprise any structurally appropriate material which can withstand processing temperatures of the thermocouple array fabrication. In one embodiment, support carrier 50 comprises copper. Support layer 20 may comprise a low dielectric constant material such as a polymer. A useful material for adhesive 54 when the support carrier comprises copper and the support layer comprises a polymer is an SPI (siloxane polyimide)-epoxy blend such as disclosed in Gorczyca et al., U.S. Pat. No. 5,161,093, issued Nov. 3, 1992.

First patterned conductive layer 12 can be applied to dielectric layer 10 by any appropriate technique. In the embodiment of FIG. 2, the first patterned conductive layer is applied to dielectric layer 10 by first being applied to support layer 20 and then having dielectric layer 10 situated over the first patterned conductive layer. First patterned conductive layer 12 can be applied to the support layer by any appropriate technique such as, for example, spraying, sputtering, or lamination with an adhesive (not shown) either before or after the support layer is attached to the support carrier. The first patterned conductive layer can be applied in an unpatterned sheet form and then patterned with photoresist using conventional photolithographic techniques to produce a series of electrical runs.

The appropriate material for dielectric layer 10 will depend upon the intended use and environment of the thermocouple array. A material such as KAPTON™ polyimide (KAPTON is a trademark of E. I. duPont de Nemours & Co.) or UPILEX™ polyimide (UPILEX is a trademark of UBE Industries, Ltd.) provides a rugged and abrasion-resistant array but is not easily conformed to complex surface topologies such as female breast tissue. Silicone rubber membranes allow greater flexibility. Dielectric layer 10 can be applied by techniques such as spinning, spraying, or, as shown, using an adhesive 11. In one embodiment, adhesive 11 comprises an SPI-epoxy blend.

Via openings 14 can be formed in dielectric layer 10 using a mechanical punching process, a chemical etch process, or a laser drilling process such as described in Eichelberger et al., U.S. Pat. No. 4,894,115, issued Jan. 6, 1990, and Eichelberger et al., U.S. Pat. No. 4,835,704, issued May 30, 1989, for example. The via openings can be cleaned using a reactive ion etching process to provide a clean surface of the first patterned conductive layer on the bottoms of the via openings.

Second patterned conductive layer 16 can be applied either before or after the dielectric layer is attached to the support layer and the first patterned conductive layer by any appropriate technique such as, for example, spraying, sputtering, or lamination with an adhesive (not shown). In one embodiment wherein the second patterned conductive layer is applied after the dielectric layer is attached, the second patterned conductive layer is sputtered or evaporated onto the top of dielectric layer 10 and through the via openings to extend to each exposed portion of first patterned conductive layer 12. If the second patterned conductive layer is applied prior to attaching the dielectric layer, an additional conductive pattern (not shown), which preferably comprises a material the same as either the first or second patterned conductive layers, will need to be applied to extend into the via openings and couple the first and second patterned conductive layers. The second patterned conductive layer can be patterned in the same manner as the first patterned conductive layer.

Individual thermoelectric materials (in this example the first and second patterned conductive layers) are frequently characterized for practical purposes by a quantity called thermal emf (electromotive force). The term "thermal emf" herein means the thermal emf per degree of temperature unit of the material relative to platinum. A thermal emf can be a positive or a negative number and is typically expressed in units of microvolts per degree Celsius ($\mu v/°$ C.).

The first and second patterned conductive layers must have sufficiently different thermal emfs. The sensitivity of the voltage measuring equipment used in a particular application will affect what difference in thermal emfs is sufficient for practical measurement purposes.

In a preferred embodiment, one of the first and second patterned conductive layers comprises constantan (an alloy of about 55% copper and 45% nickel) and the other of the first and second patterned conductive layers comprises copper. At a temperature of 200° C., for example, the thermal emf of copper would be +9.15 $\mu v/°$ C. and the thermal emf of constantan would be −37.25 $\mu v/°$ C. with the difference in thermal emf being 46.4 $\mu v/°$ C. Another example embodiment is copper and an alloy of Ni 90% and Cr 10% (having a thermal emf at 200° C. of 29.8 $\mu v/°$ C.) which have a thermal emf difference of about 67 $\mu v/°$ C. One pair of conductive layers with a very high difference in thermal emf (765 $\mu v/°$ C.) is germanium (+362 $\mu v/°$ C.) and silicon (−403 $\mu v/°$ C.). Pairs of conductive layers with a very low thermal emf difference (about 1 $\mu v/°$ C.) include platinum and rhodium alloys. For practical applications, the thermal emf difference will typically range from about 1 $\mu v/°$ C. to about 67 $\mu v/°$ C.

The above examples of one patterned conductive layer comprising a material having a positive thermal emf and the other patterned conductive layer comprising a material having a negative thermal emf are for purposes of illustration only. The significant factor is that the two patterned conductive layers have sufficiently different thermal emfs, even if both are positive or both are negative. Either of the layers may be applied first. In a preferred embodiment, the patterned conductive layer which will be positioned closest to the region to be sensed will be the first patterned conductive layer so that the contact between the first and second patterned conductive layers will be as close to the region as possible.

Whereas the above description is of an interconnect system having the interconnections between patterned conductive layers 12 and 16 directly through dielectric layer 10, it would be possible to have both conductive layers interconnected through vias to another interconnect pattern (not shown) through another dielectric layer (such as support layer 20). Similarly, it would be possible to pattern two conductive layers on one surface of the dielectric layer, pattern an other layer comprising one of the two conductive layer materials on the opposite surface, and form vias and interconnections down to the other layer. These embodiments can be used to minimize the lateral thermal conductivity of the thermocouple array.

Figure 3:
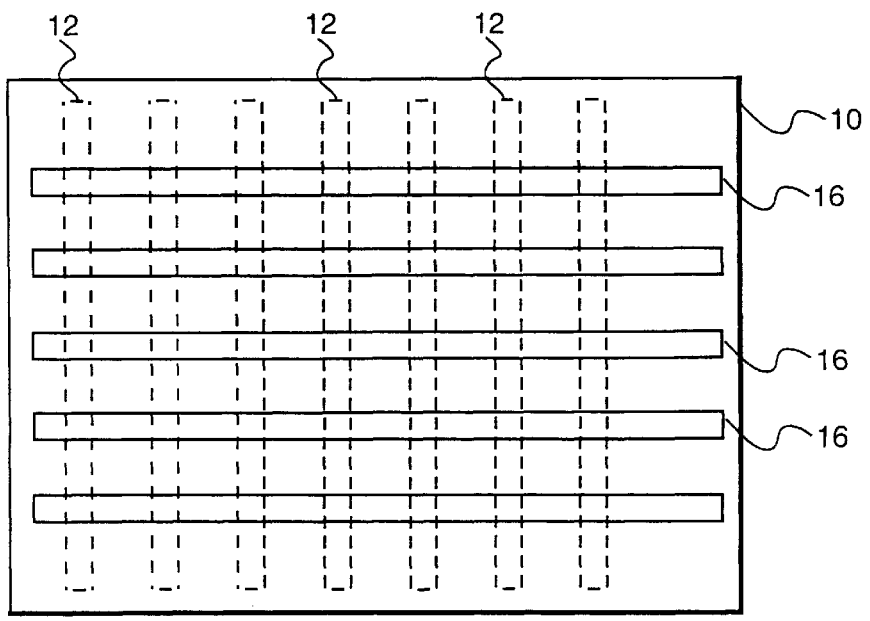
FIG. 3 is a top view of the second patterned conductive layer overlying the dielectric layer and the first patterned conductive layer.

FIG. 3 is a top view of second patterned conductive layer 16 overlying dielectric layer 10 and first patterned conductive layer 12. In this embodiment the thermocouple array is a rectangular grid of rows and columns with via openings (not shown) being present to couple the patterned conductive layers where they cross.

Figure 4:
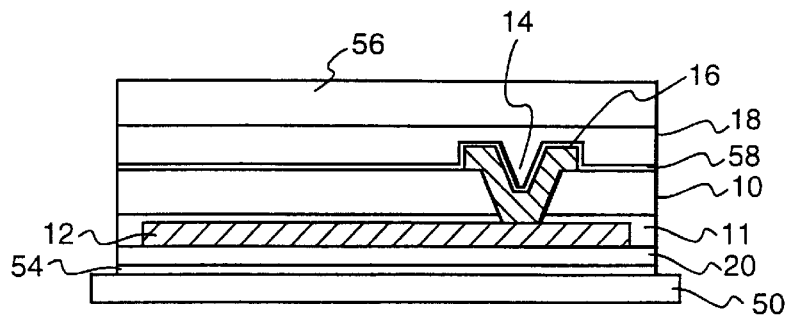
FIG. 4 is a side view similar to that of FIG. 2 further showing an additional dielectric layer.

FIG. 4 is a side view similar to that of FIG. 2 further showing an additional dielectric layer 18 which may be added after the first and second patterned conductive layers to provide mechanical protection for the thermocouple array using an adhesive 58, for example. The material used for additional dielectric layer 18 will vary according the specific application and may comprise a material such as a polymer for example. After thermocouple array fabrication is complete, the thermocouple array can be removed from support carrier 50 by peeling support layer 20 from the support carrier.

One of the additional dielectric and the support layers will be placed closest to the surface to be sensed, and this layer is preferably as thin as feasible so that its thermal mass does not interfere with the temperature measurements and the resolution is thus maximized. In one embodiment, the thickness is one mil. For medical applications in the United States, material in contact with human tissue must be a material approved by the Food and Drug Administration such as TEFLON™ polytetrafluoroethylene (TEFLON is a trademark of E. I. duPont de Nemours & Co.), silicone rubber, or latex, for example. The other of the additional dielectric and the support layers which is not in contact with the sensed surface in some applications may be sufficiently thick so as to provide a thermal barrier from air flow. A useful thickness range is about 0.005 inches to 0.25 inches, for example. Alternatively, to provide a thermal barrier, a thermally insulating material 56 can be provided to facilitate handling of the thermocouple array.

Figure 6:
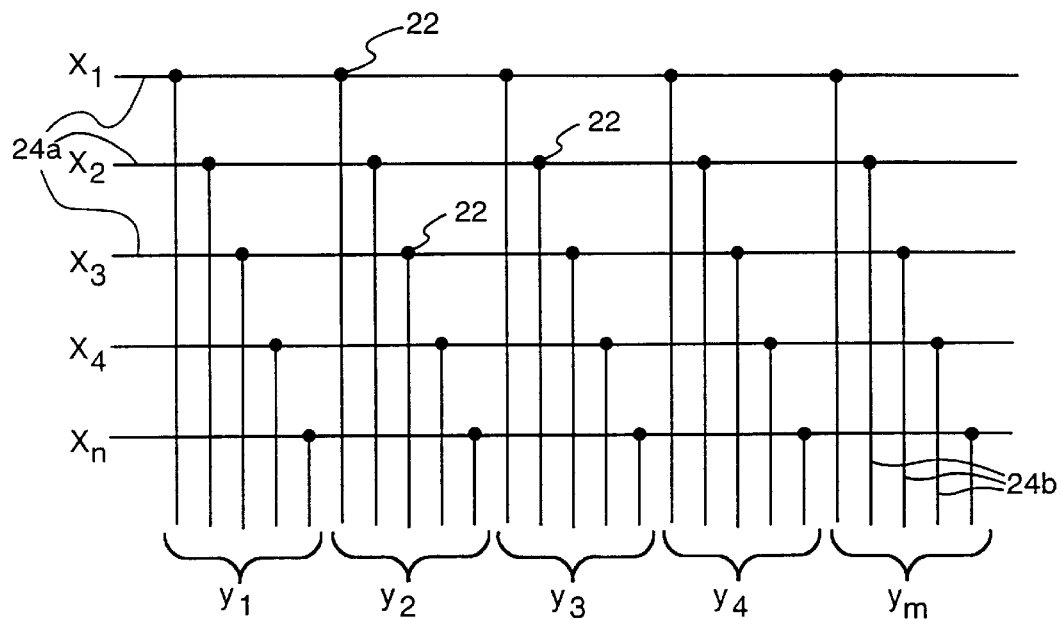
FIG. 6 is another schematic representation of first and second patterned conductive layers.
Figure 7:
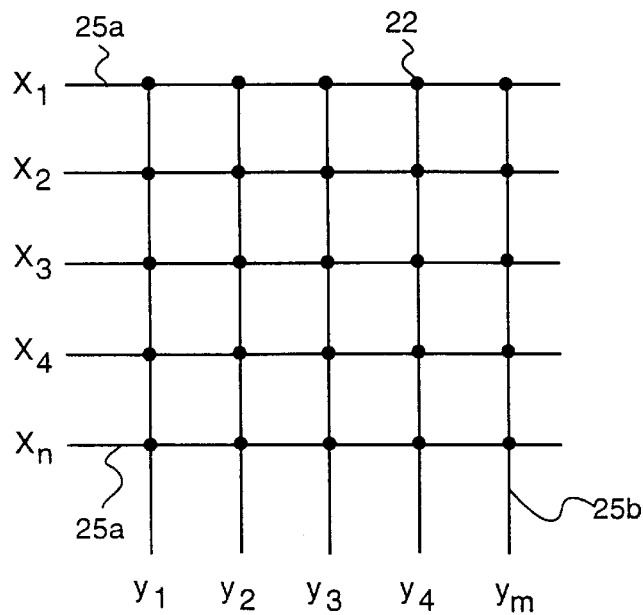
FIG. 7 is another schematic representation of first and second patterned conductive layers.
Figure 5:
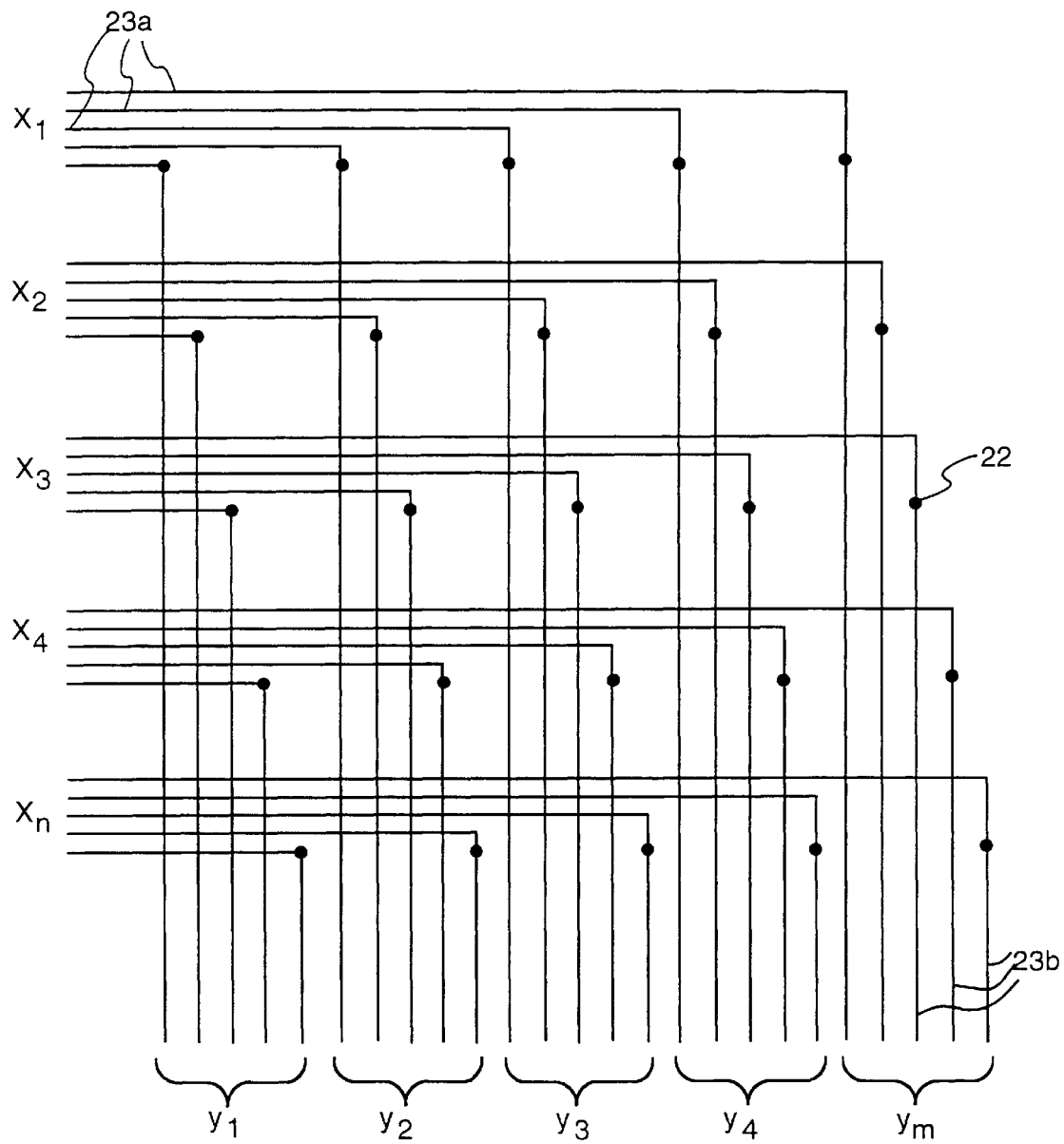
FIG. 5 is a schematic representation of first and second patterned conductive layers.

FIGS. 5–7 illustrate different schematic embodiments for the first and second patterned conductive layers, with coupling through the via openings being illustrated by joints 22. The arrays of the present invention can be electrically connected with selected joints in one of a number of ways.

FIG. 5 is one example of a schematic representation of first and second patterned conductive layers. The array is represented, for illustrative purposes with "rows" $X_1$ to $X_n$ (representative of one of the first and second patterned conductive layers) and "columns" $Y_1$ to $Y_m$ (representative of the other of the first and second patterned conductive layers) of joints 22. As shown, the rows and columns of joints of an array need not be perpendicular.

Each joint has its own respective individual leads 23a and 23b, one of which comprises a portion of the first patterned conductive layer and the other of which comprises a respective portion of the second patterned conductive layer. The embodiment of FIG. 5 thus permits simultaneous measurement of selected joints (in contrast with the arrays of FIGS. 6 and 7 wherein leads are shared and sequential measurements are appropriate). The number of leads 23a and 23b required becomes 2*n*m, wherein n is the number of "rows" and m is the number of "columns", or, if no rows or columns are used, two times the number of joints. Each lead can be attached to a respective test pad (not shown).

FIG. 6 is another schematic representation of first and second patterned conductive layers wherein joints each have one multiplexed lead 24a and one individual lead 24b. Multiplexing leads 24a reduces the number of required leads to m*(n+1).

EXPERIMENT

A five by five thermocouple array was fabricated using the schematic embodiment shown in FIG. 6 as follows. A five micron thick sheet of constantan (first patterned conductive layer 12) was applied to a 0.001 inch thick UPILEX polyimide film (dielectric layer 10) using an adhesive comprising ULTEM™ polyetherimide (ULTEM is a trademark of the General Electric Co.). The constantan was patterned using conventional photoresist. Support carrier 50 and support layer 20 of FIG. 1 were not used. Instead the polyimide was taped to a processing frame (not shown) for support during thermocouple fabrication. After patterning the constantan, the dielectric layer was inverted and via openings 14 were formed by laser ablation of the dielectric layer and the adhesive and cleaned by reactive ion etching. Then a 4.5 micron thick copper conductor layer (second patterned conductive layer 16) was formed by first sputtering a thin (<3000Å) layer of copper onto the dielectric surface and further increasing the conductor thickness by electroplating to 4.5 micron total thickness. An intimate metallurgical joint was provided between the constantan and copper layers at the bottom of each of the via openings. The second conductive layer was patterned with photoresist, and the thermocouple array provided reliable results when tested.

FIG. 7 is another schematic representation of first and second patterned conductive layers wherein both the "rows" and "columns" of the joints are multiplexed so that the number of leads 25a and 24b for joints 22 is reduced to n+m. Although less leads are required in this embodiment, the analysis of the data becomes more complicated.

The embodiment of FIG. 5 provides each joint with individual leads and therefore permits extremely sensitive measurements. In the embodiment of FIG. 6, each joint has one individual lead and one shared lead. In the embodiment of FIG. 7, each joint has two shared leads. Shared leads save in electronic implementation costs but reduce sensitivity.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for detecting temperature gradients in biological tissue, the method comprising:

providing a thermocouple array including a dielectric layer having via openings therethrough, a first patterned conductive layer facing one surface of the dielectric layer, and a second patterned conductive layer comprising a different material than the first patterned conductive layer and facing another surface of the dielectric layer, portions of the second patterned conductive layer being coupled through the via openings to respective portions of the first patterned conductive layer, the second patterned conductive layer having a different thermal emf than the first patterned conductive layer, the dielectric layer, the first patterned conductive layer, and the second patterned conductive layer being surface-conformable;

situating the thermocouple array in surface-conforming thermal contact with the biological tissue; and detecting temperature gradients in the biological tissue.

2. The method of claim 1 wherein detecting temperature gradients in the biological tissue includes using at least one voltmeter.

\* \* \* \* \*